(12) United States Patent
Iwai et al.

(10) Patent No.: US 7,056,831 B2
(45) Date of Patent: Jun. 6, 2006

(54) PLASMA PROCESSING APPARATUS AND PLASMA PROCESSING METHOD

(75) Inventors: Tetsuhiro Iwai, Kasuga (JP); Kiyoshi Arita, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 194 days.

(21) Appl. No.: 10/621,497

(22) Filed: Jul. 17, 2003

(65) Prior Publication Data

US 2004/0050496 A1    Mar. 18, 2004

(30) Foreign Application Priority Data

Jul. 18, 2002  (JP)  .......................... P. 2002-209052

(51) Int. Cl.
*H01L 21/302*    (2006.01)

(52) U.S. Cl. ...................... 438/715; 438/706; 438/710; 156/345.51

(58) Field of Classification Search ............... 438/706, 438/710, 712, 714, 720, 715; 156/345.35, 156/345.38, 345.51, 345.52, 345.53, 47, 156/34, 345.47
See application file for complete search history.

(56) References Cited

U.S. PATENT DOCUMENTS 4,565,601 A * 1/1986 Kakehi et al. ................. 216/59

| | | |
|---|---|---|
| 5,792,376 A | 8/1998 | Kanai et al. |
| 6,254,683 B1 | 7/2001 | Matsuda et al. |
| 6,884,717 B1 * | 4/2005 | Desalvo et al. ............. 438/667 |

FOREIGN PATENT DOCUMENTS

| | | |
|---|---|---|
| JP | 2000-173982 | 6/2000 |
| JP | 2001-284332 | 10/2001 |
| JP | 2002-305171 | 10/2002 |

* cited by examiner

*Primary Examiner*—Lan Vinh
(74) *Attorney, Agent, or Firm*—Pearne & Gordon LLP (57) ABSTRACT

In a plasma processing apparatus for plasma-processing a silicon wafer 6 to which a protective film 6a is stuck in a state that the silicon wafer 6 is held by a first electrode 3 by electrostatic absorption and is being cooled, the top surface 3g of the first electrode 3 consists of a top surface central area A that is inside a boundary line P2 that is distant inward by a prescribed length from the outer periphery P1 of the silicon wafer 6 and in which the conductor is exposed, and a ring-shaped top surface peripheral area B that surrounds the top surface central area A and in which the conductor is covered with an insulating coating 3f. This structure makes it possible to hold the silicon wafer 6 by sufficient electrostatic holding force by bringing the silicon wafer 6 into direct contact with the conductor and to increase the cooling efficiency by virtue of heat conduction from the silicon wafer 6 to the first electrode 3.

3 Claims, 7 Drawing Sheets

PLASMA PROCESSING APPARATUS AND PLASMA PROCESSING METHOD

BACKGROUND OF THE INVENTION

The present invention relates to a plasma processing apparatus and a plasma processing method for plasma-processing a semiconductor substrate such as a silicon wafer.

In manufacturing processes of silicon wafers for semiconductor devices, thinning processing for decreasing the thickness of a substrate has come to be performed increasingly as the thickness of semiconductor devices has decreased. In the thinning processing, after formation of circuit patterns on the front surface of a silicon substrate, the back surface, that is, the surface opposite to the circuit formation surface, is ground mechanically. After the mechanical grinding, plasma processing is performed to etch away a damaged layer that has been formed on the ground surface of the silicon substrate by the grinding.

In the plasma processing, the silicon wafer is held in a state that its circuit formation surface faces the mounting surface of a substrate mounting portion because the processing subject surface (i.e., back surface) of the silicon wafer needs to be located above. To prevent the circuits from directly touching the mounting surface and thereby being damaged, a protective film is stuck to the circuit formation surface.

One method for holding such a silicon wafer is a method utilizing electrostatic absorption. In this method, a silicon wafer is placed on a substrate mounting portion in which the surface of a conductor is covered with a thin insulating layer. A DC voltage is applied to the conductor to make the surface of the substrate mounting portion an electrostatic absorption surface. The silicon wafer is held by the substrate mounting portion by Coulomb force that acts between the silicon wafer and the conductor that is located under the insulating layer.

However, where a silicon wafer to which a protective film (mentioned above) is stuck is held by electrostatic absorption, the Coulomb force acts on the conductor via not only the insulating layer but also the insulative protective film and hence the electrostatic absorption force is weaker than in a case that the silicon wafer is in direct contact with the electrostatic absorption surface (i.e., without intervention of a protective film); sufficient holding force may not be obtained.

Further, since the entire surface of the substrate mounting portion is covered with the insulating layer, in a state that the silicon wafer is mounted thereon, the silicon wafer is not in direct contact with the conductor of the substrate mounting portion and hence the conductivity of heat from the silicon wafer to the substrate mounting portion is low. This makes it difficult to cool the silicon wafer by removing heat from it efficiently during plasma processing. If the substrate temperature increases excessively, the protective film that is stuck to the substrate receives heat damage. In view of this, in setting plasma processing conditions, the output power for plasma processing of a power source needs to be set low, that is, the output power is restricted by the substrate cooling ability of the substrate mounting portion. As described above, where the processing object is a semiconductor substrate having an insulating layer (protective film), it is difficult to increase the cooling efficiency while maintaining sufficient electrostatic holding force; it is difficult to realize plasma processing having a high etching rate.

SUMMARY OF THE INVENTION

An object of the present invention is therefore to provide a plasma processing apparatus and a plasma processing method capable of increasing the cooling efficiency of a semiconductor substrate while holding it by sufficient electrostatic holding force.

According to the first aspect of the invention, a plasma processing apparatus for plasma-processing a surface of a substrate having an insulating layer on the front surface that is accommodated in a processing room, comprises: an electrode that is a conductor and has a top surface that is greater in external size than the substrate; cooling means for cooling the electrode; a DC power section for applying a DC voltage to the electrode to cause the top surface of the electrode to hold the substrate by electrostatic absorption; pressure lowering means for lowering pressure inside the processing room; a plasma generation gas supply section for supplying a plasma generation gas to the processing room; and a radio-frequency power section for generating plasma in the processing room by applying a radio-frequency voltage to the electrode, wherein the top surface of the electrode has a top surface central area that is inside a boundary line that is distant inward by a prescribed length from an outer periphery of the substrate and in which the conductor is exposed, and a ring-shaped top surface peripheral area that surrounds the top surface central area and in which the conductor is covered with an insulating coating.

Preferably, in the plasma processing apparatus, an outer peripheral portion of the insulating layer of the substrate being held by the top surface of the electrode is in contact with the insulating coating in an area between the outer periphery and the boundary line.

Preferably, the plasma processing apparatus further comprises an insulating portion that covers an outer peripheral portion of the insulating coating in ring form.

Preferably, in the plasma processing apparatus, the insulating coating extends to cover part of a side surface of the electrode.

Preferably, in the plasma processing apparatus, the insulating coating is made of alumina.

According to the second aspect of the invention, a plasma processing method in which an electrode that is a conductor and has a top surface that is greater in external size than a substrate to be plasma-processed that has an insulating layer on a front surface thereof is provided in a processing room, the top surface of the electrode has a top surface central area that is inside a boundary line that is distant inward by a prescribed length from an outer periphery of the substrate and in which the conductor is exposed and a ring-shaped top surface peripheral area that surrounds the top surface central area and in which the conductor is covered with an insulating coating, and plasma processing is performed in a state that the substrate is held by the top surface of the electrode by electrostatic absorption and the electrode is being cooled, wherein the substrate is mounted on the top surface of the electrode in such a manner that a central portion and a peripheral portion of the insulating layer of the substrate are in contact with the top surface central area and the insulating coating in the top surface peripheral area, respectively; the substrate is electrostatically absorbed on the top surface central area by mainly utilizing the central portion of the insulating layer as a dielectric for electrostatic absorption; and the top surface central area of the electrode is insulated from plasma by bringing the outer peripheral portion of the insulating layer into close contact with the insulating coating.

Preferably, in the plasma processing method, the substrate is a semiconductor substrate on the front surface of which logic circuits are formed, and a back surface of the semiconductor substrate is etched by the plasma processing.

Preferably, in the plasma processing method, microcracks that have developed on the back surface of the semiconductor substrate in mechanical processing are etched away.

According to the invention, the top surface of the electrode for holding a substrate by electrostatic absorption consists of the top surface central area that is inside the boundary line that is distant inward by a prescribed length from the outer periphery of the substrate and in which the conductor is exposed, and the ring-shaped top surface peripheral area that surrounds the top surface central area and in which the conductor is covered with the insulating coating. This structure makes it possible to hold the substrate by sufficient electrostatic holding force and to increase the cooling efficiency of the substrate by bringing the substrate into close contact with the electrode.

DETAILED DESCRIPTION OF THE PREFERRED EMBODIMENTS

Figure 1:
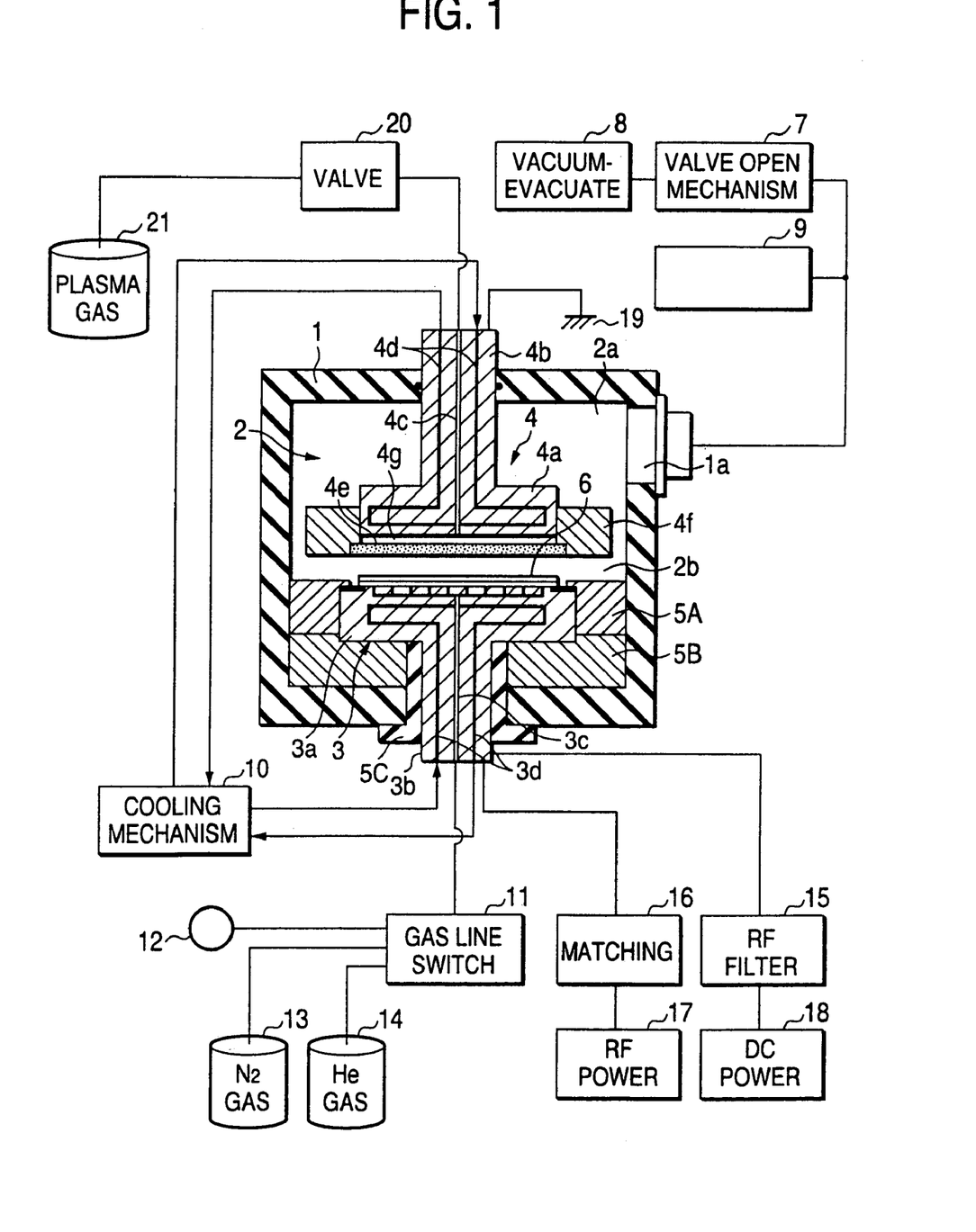
FIG. 1 is a side sectional view of a plasma processing apparatus according to an embodiment of the invention.
Figure 2:
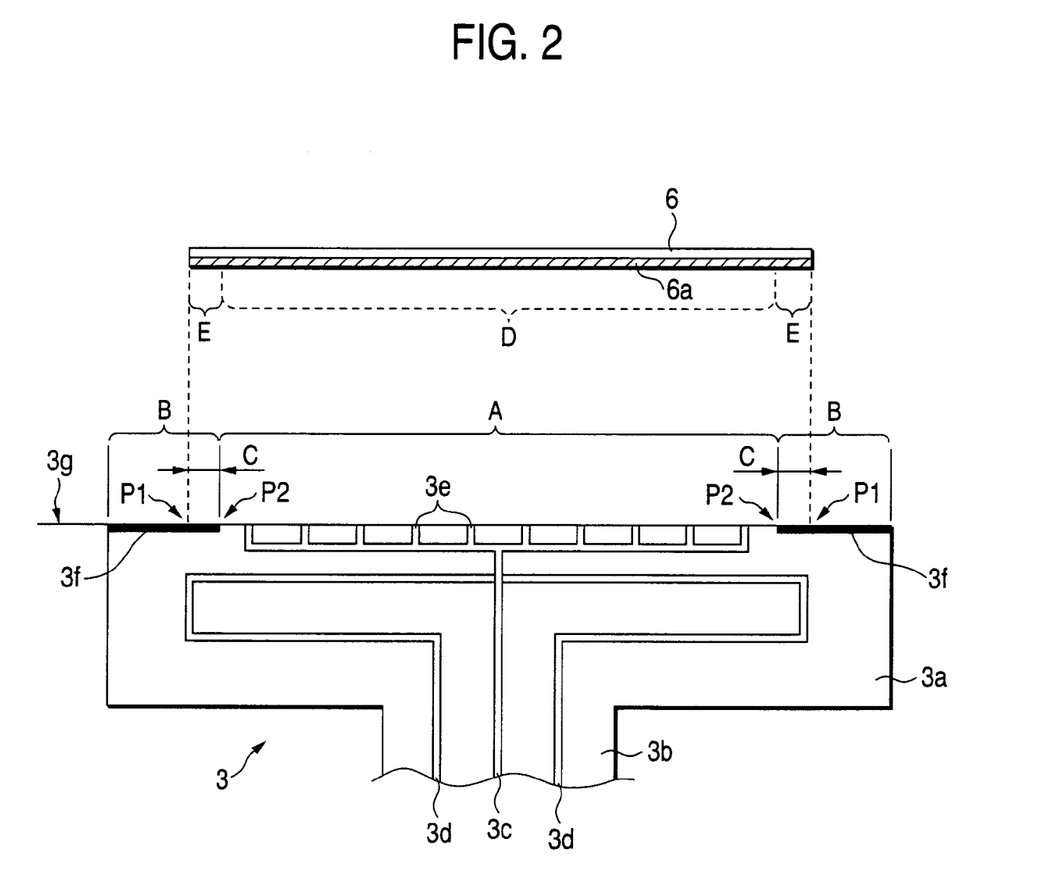
FIG. 2 is a side sectional view of a first electrode of the processing apparatus according to the embodiment of the invention.
Figure 3:
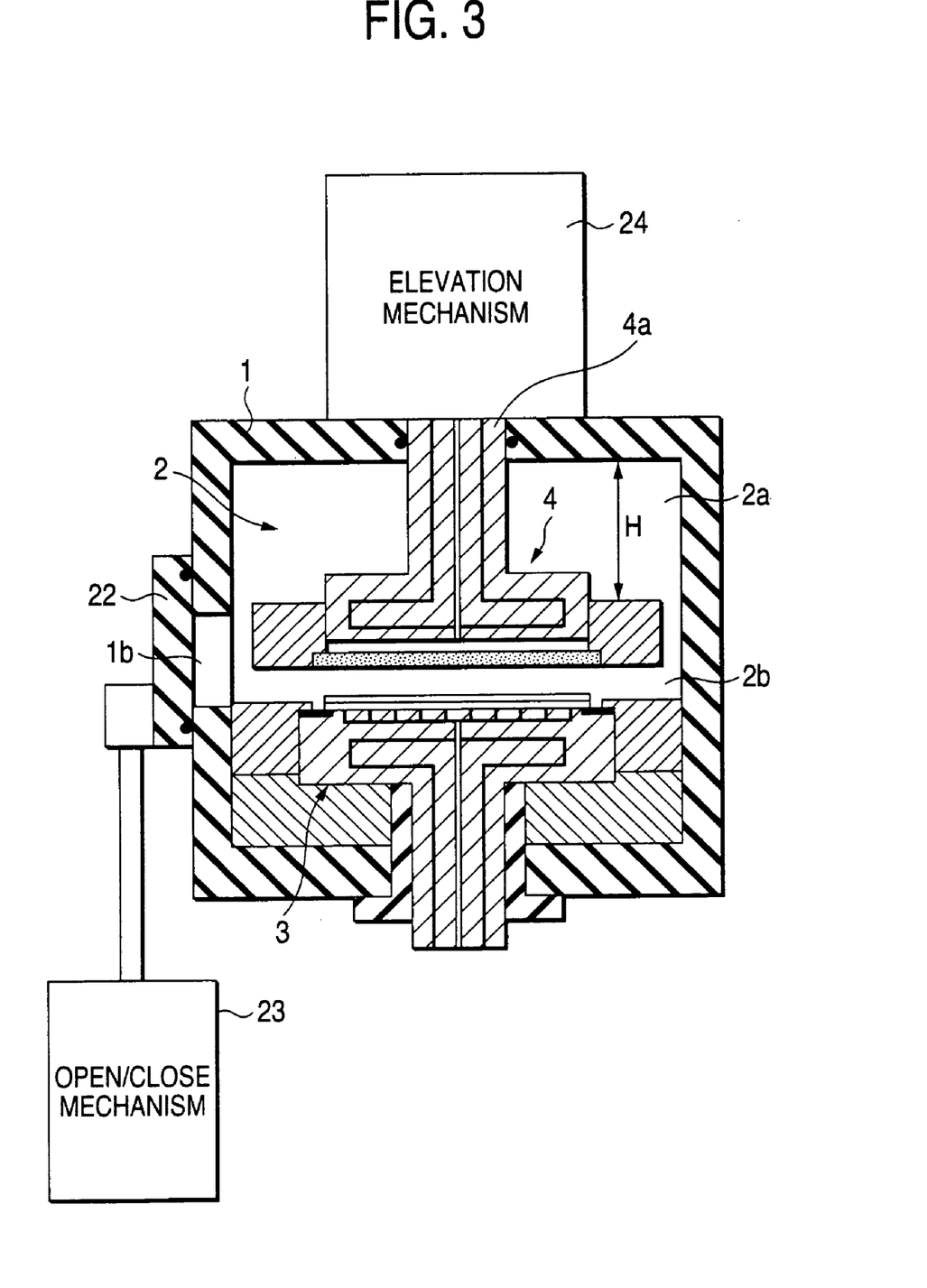
FIG. 3 is a side sectional view of the plasma processing apparatus according to the embodiment of the invention.
Figure 4:
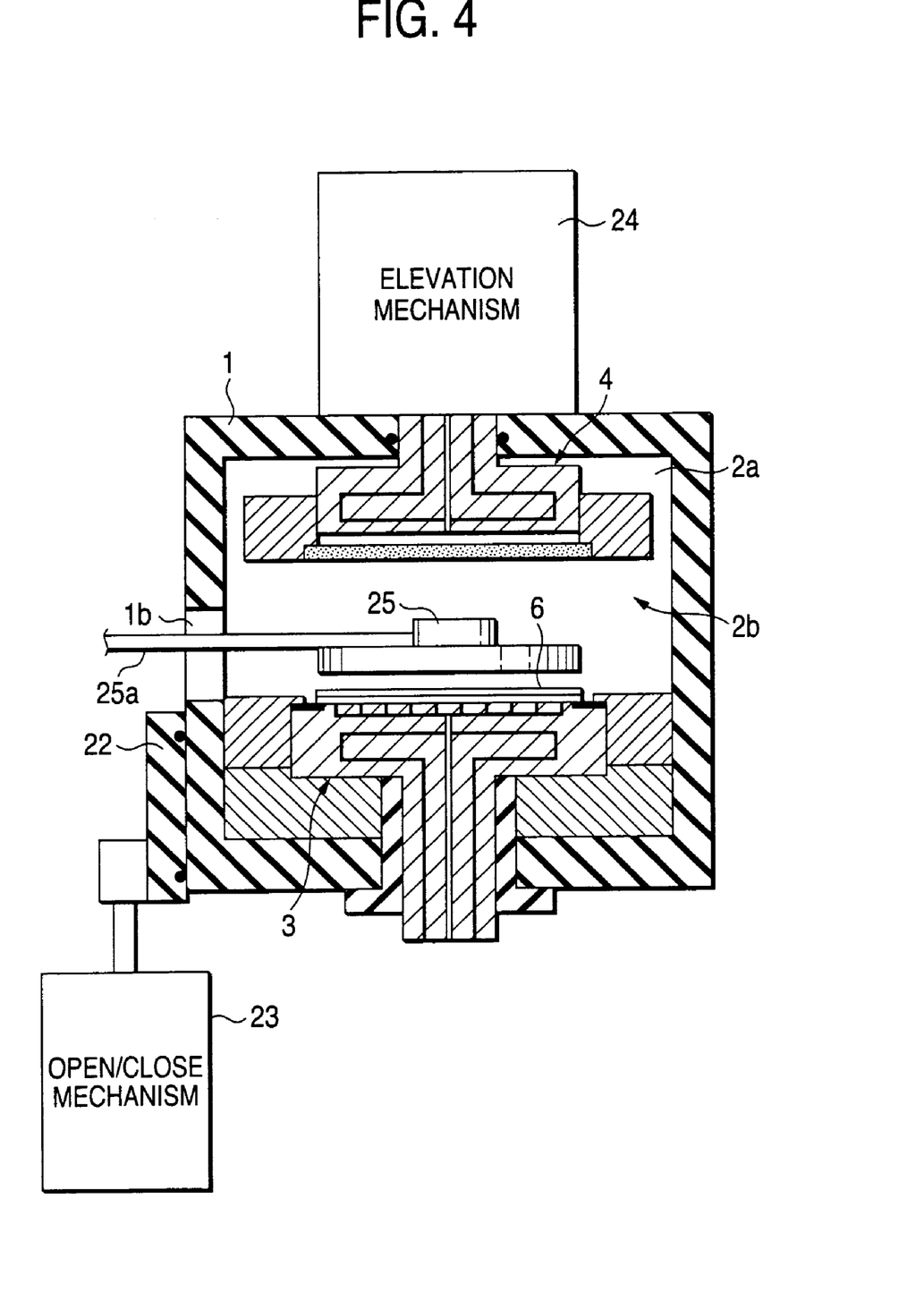
FIG. 4 is a side sectional view of the plasma processing apparatus according to the embodiment of the invention.
Figure 5:
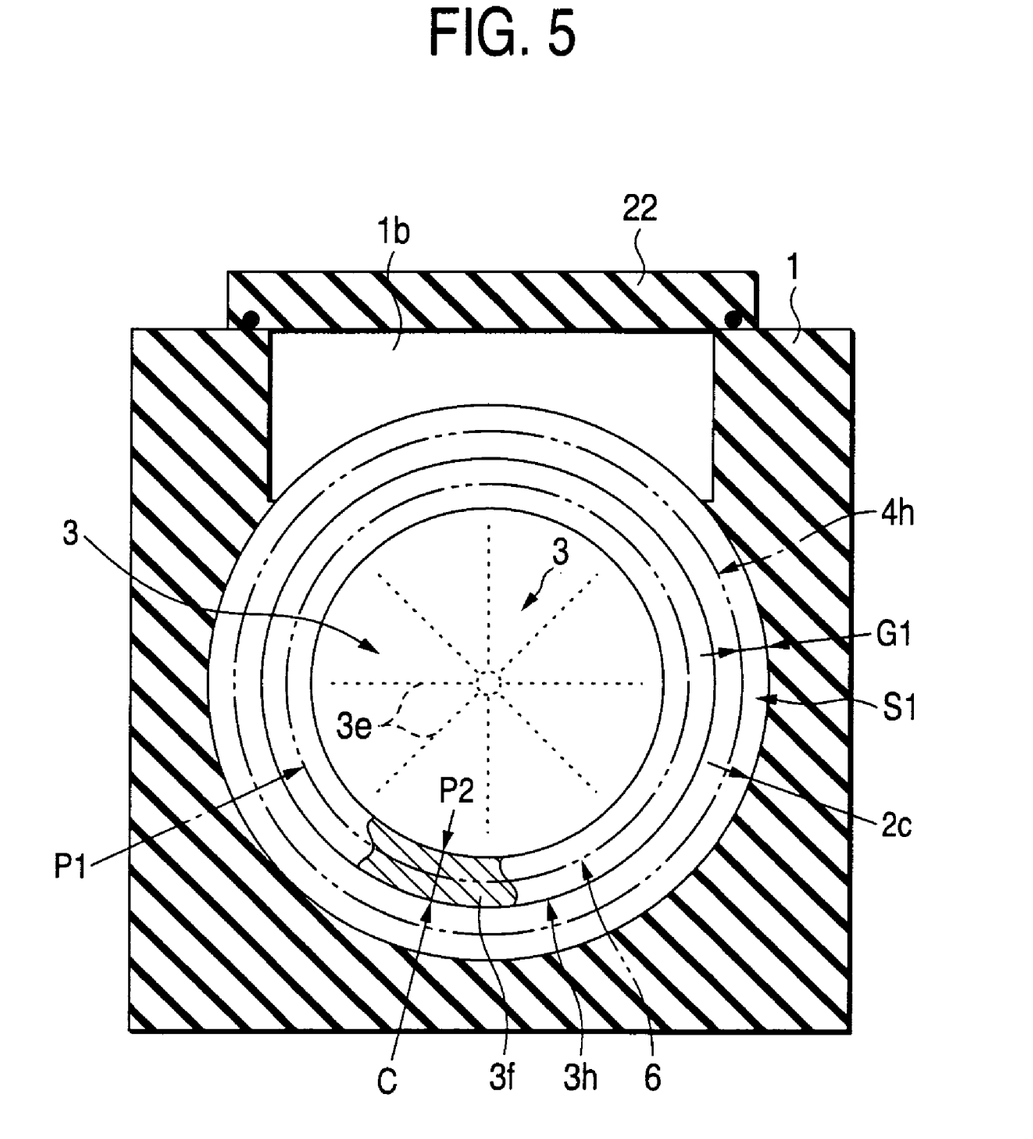
FIG. 5 is a horizontal sectional view of the plasma processing apparatus according to the embodiment of the invention.
Figure 6:
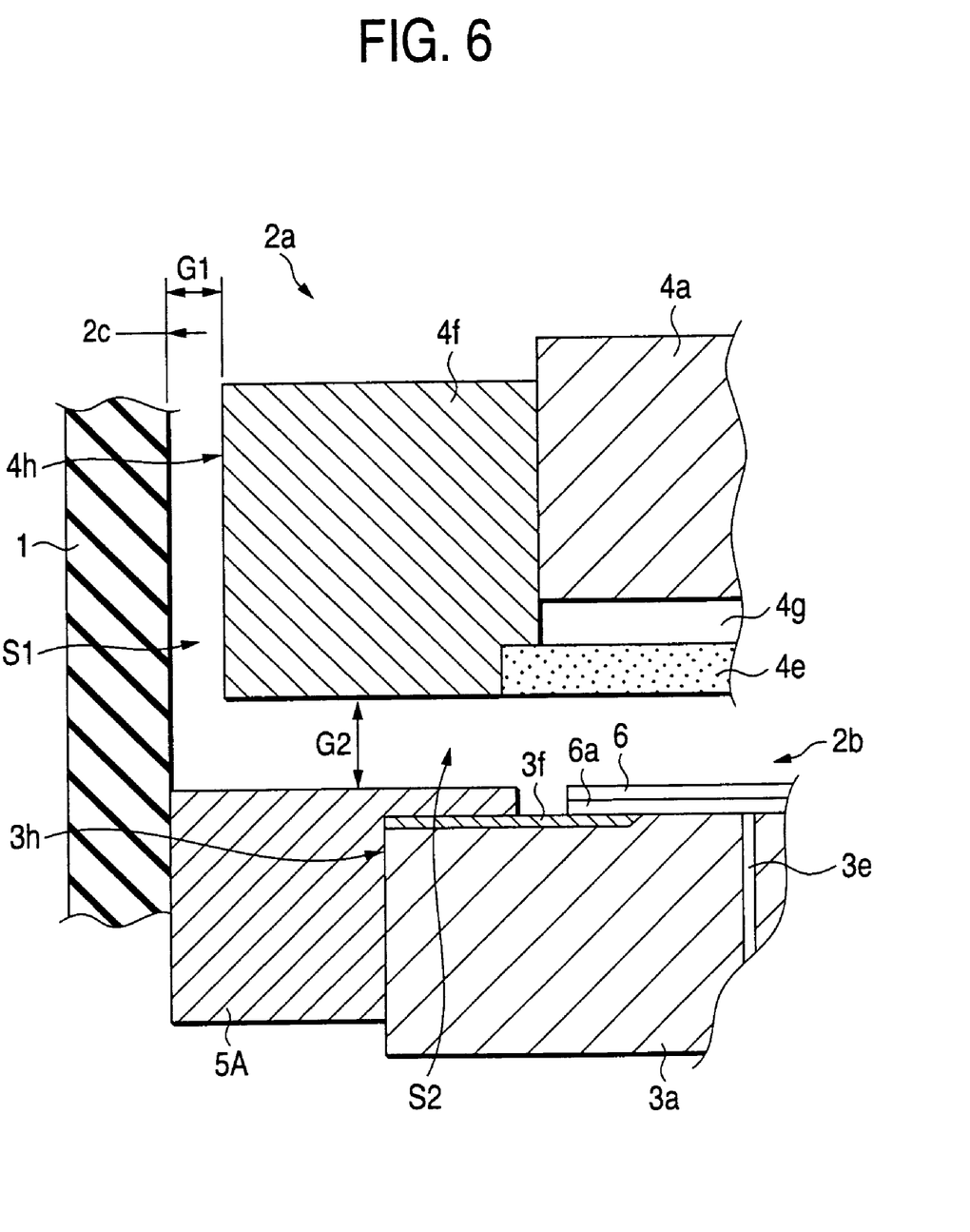
FIG. 6 is a partial sectional view of the plasma processing apparatus according to the embodiment of the invention.
Figure 7A:
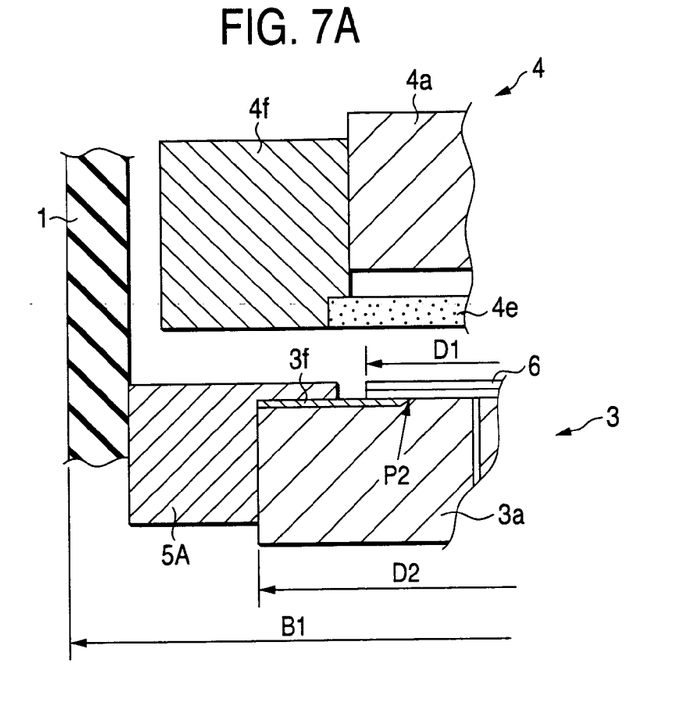
FIGS. 7A and 7B are partial sectional views of the plasma processing apparatus according to the embodiment of the invention.
Figure 7B:
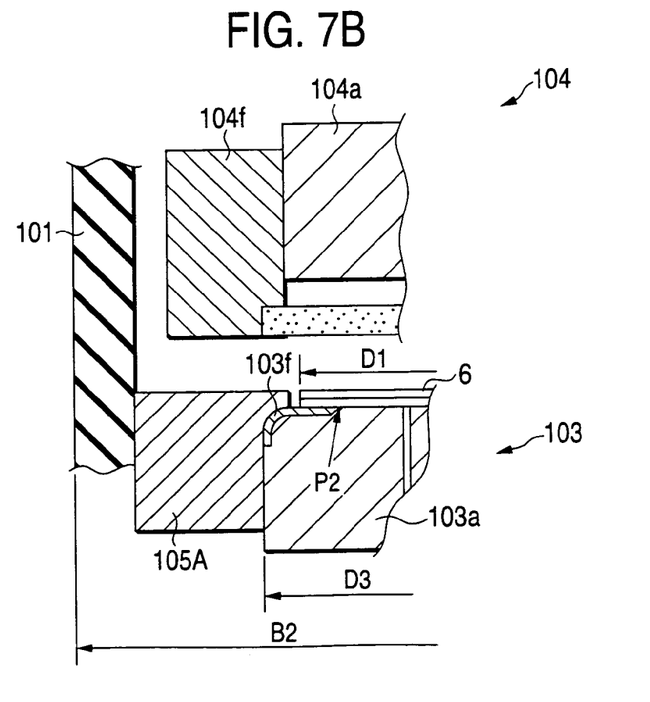

An embodiment of the present invention will be hereinafter described with reference to the drawings. FIG. 1 is a side sectional view of a plasma processing apparatus according to an embodiment of the invention. FIG. 2 is a side sectional view of a first electrode of the processing apparatus according to the embodiment of the invention. FIGS. 3 and 4 are side sectional views of the plasma processing apparatus according to the embodiment of the invention. FIG. 5 is a horizontal sectional view of the plasma processing apparatus according to the embodiment of the invention. FIGS. 6 and 7A and 7B are partial sectional views of the plasma processing apparatus according to the embodiment of the invention.

First, the configuration of the plasma processing apparatus will be described with reference to FIG. 1. As shown in FIG. 1, a processing room 2 where to perform plasma processing is provided in a vacuum chamber 1; a closed processing space in which to generate plasma under a low pressure can be formed in the processing room 2. The processing room 2 has a cylindrical shape (see FIG. 5), and a first electrode 3 and a second electrode 4 are arranged in the vertical direction so as to be opposed to each other in the processing room 2. The first electrode 3 and the second electrode 4 have cylindrical shapes and are arranged concentrically in the processing room 2.

The first electrode 3 is surrounded by two layers of insulators 5A and 5B that are inserted to fill a bottom portion of the processing room 2, and is thereby fixed in such a manner that its top surface for holding a processing object is exposed at the center of the bottom of the processing room 2. The first electrode 3 is made of a conductive material such as aluminum, and has a structure that a support portion 3b extends downward from a disc-shaped electrode portion 3a. The support portion 3b is held by the vacuum chamber 1 via an insulating member 5C, whereby the first electrode 3 is electrically insulated.

Like the first electrode 3, the second electrode 4 is made of a conductive material such as aluminum. The second electrode 4 has a structure that a support portion 4b extends upward from a disc-shaped electrode portion 4a. The support portion 4b is electrically continuous with the vacuum chamber 1. The second electrode 4 can be elevated and lowered by an elevation mechanism 24 (see FIG. 3). In a state that the second electrode 4 is lowered, the processing space of the processing room 2 is partitioned by the second electrode 4 into two spaces having different functions.

More specifically, a discharging space 2b is formed under the second electrode 4, that is between the second electrode 4 and the first electrode 3 and an exhaust space 2a is formed over the second electrode 4, that is, between the second electrode 4 and the ceiling surface of the vacuum chamber 1. The discharging space 2b is a space in which plasma discharge is caused to perform plasma-processing on a silicon wafer 6 that is mounted on the first electrode 3. The exhaust space 2a is a space through which to exhaust a gas from the discharging space 2b.

Next, the structure of the first electrode 3 will be described in detail with reference to FIGS. 1 and 2. The top surface of the electrode portion 3a of the first electrode 1 is a mounting surface on which a silicon wafer 6 as a processing object (substrate) is mounted, and is larger in external size than the silicon wafer 6. The silicon wafer 6 is a semiconductor substrate on whose front surface logic circuits are formed. The back surface of the silicon wafer 6 that is opposite to the circuit formation surface is etched by plasma processing after being ground by mechanical processing. Microcracks that have developed on the back surface of the silicon wafer 6 in the mechanical processing are removed by the etching.

As shown in FIG. 2, the top surface of the first electrode 3 is divided into two areas, that is, an inside area and an outside area, by a boundary line P2 that is distant inward by a prescribed length C from an outer periphery position P1 of the silicon wafer 6 as mounted on the first electrode 3. That is, the area inside the boundary line P2 is a top surface central area A where the conductive material (aluminum) is exposed and the area outside the boundary line P2 is a ring-shaped top surface peripheral area B that surrounds the top surface central area A and in which the conductive material (aluminum) is covered with an insulating coating 3f. The prescribed length C need not always be constant along the entire circumference and may vary with the circumferential position.

The insulating coating 3f is made of a ceramic material such as alumina. As shown in FIG. 1, in a state that the first electrode 3 is provided in the vacuum chamber 1, part (i.e., an outer peripheral portion) of the insulating coating 3f is covered with the insulator 5A (also see FIG. 6). With this measure, an outer peripheral portion of the first electrode 3 is insulated from plasma that is generated in the discharging space 2b, whereby an abnormal discharge is prevented.

As shown in FIG. 2, a protective film 6a is stuck to the front surface (i.e., the circuit formation surface; drawn as the bottom surface in FIG. 2) of the silicon wafer 6. During plasma processing, the protective film 6a is opposed to the top surface 3g of the first electrode 3, that is, the silicon wafer 6 is mounted on the first electrode 3 with its mechanically ground surface up. The protective film 6 is a resin film, that is, a film made of an insulative resin such as polyolefin, polyimide, or polyethylene terephthalate and having a thickness of about 100 μm. The protective film 6 is stuck to the circuit formation surface of the silicon wafer 6 with an adhesive. The protective film 6 being stuck to of the silicon wafer 6 is an insulating layer on its circuit formation surface (i.e., the front surface), and functions (describer later) as a dielectric when the silicon wafer 6 is absorbed electrostatically.

As shown in FIG. 2, the silicon wafer 6 is mounted on the first electrode 3 in such a manner that a central portion D and an outer peripheral portion E of the protective film 6a on the silicon wafer 6 are brought into contact with the top surface central area A and the insulative coating 3f (located over the top surface peripheral area B), respectively, of the first electrode. In this state, the outer peripheral portion E of the protective film 6a on the silicon wafer 6 that is held by the top surface 3g of the first electrode 3 coextends with and is in contact with the insulating coating 3f in the area between the outer periphery position P1 and the boundary line P2.

The silicon wafer 6 is electrostatically absorbed on the top surface central area A by mainly utilizing the central portion D of the protective film 6a as a dielectric for electrostatic absorption. At this time, even in the outer peripheral area E, an electrostatic absorption force acts, though slightly, on the silicon wafer 6 via the protective film 6a and the insulating coating 3f. These electrostatic absorption forces bring the outer peripheral portion E of the protective film 6a into close contact with the insulating coating 3f.

In this close contact state, the boundary line P2 which is the outer periphery of the top surface central area A of the top surface of the first electrode 3 in which the conductor is exposed is covered with the silicon wafer 6 irrespective of variations in the outer diameter of the silicon wafer 6 and the mounting position of the silicon wafer 6 on the first electrode 3. Therefore, the conductor of the first electrode 3 is reliably protected from plasma in the discharging space 2b. As a result, an abnormal discharge involving the first electrode 3 can be prevented during plasma discharge and the operation state of the plasma processing apparatus can be stabilized.

As shown in FIG. 2, a number of absorption holes 3e are formed in the first electrode 3 so as to reach its top surface and to communicate with a suction hole 3c that is formed inside the first electrode 3. The suction hole 3c is connected to a vacuum absorption pump 12 via a gas line switching opening/closing mechanism 11. As shown in FIG. 1, the gas line switching opening/closing mechanism 11 is connected to an $N_2$ gas supply section 13 for supplying a nitrogen gas and a He gas supply section 14 for supplying a helium gas. The suction hole 3c can be connected selectively to the vacuum absorption pump 12, the $N_2$ gas supply section 13, and the He gas supply section 14 by switching the gas line switching opening/closing mechanism 11.

If the vacuum absorption pump 12 is driven in a state that the absorption hole 3c communicates with the vacuum absorption pump 12, vacuum suction is effected through the absorption holes 3e and the silicon wafer 6 that is mounted on the first electrode 3 is vacuum-absorbed and held. Therefore, the absorption holes 3e, the suction hole 3c, and the vacuum absorption pump 12 constitute a vacuum holding means for holding the silicon wafer 6 by vacuum-absorbing the silicon wafer 6 through the absorption holes 3e which are formed in the first electrode 3 so as to reach its top surface.

If the suction hole 3c is connected to the $N_2$ gas supply section 13 or the He gas supply section 14, a nitrogen gas or a helium gas can be applied to the bottom surface (as viewed in FIG. 2) of the silicon wafer 6 through the absorption holes 3e. As described later, the nitrogen gas is a blowing gas for forcibly detaching the silicon wafer 6 from the mounting surface 3g and the helium gas is a heat transmission gas with which the absorption holes 3e are charged to accelerate cooling of the silicon wafer 6 during plasma processing.

A coolant passage 3d for cooling is formed in the first electrode 3 and is connected to a cooling mechanism 10. If the cooling mechanism 10 is driven, a coolant such as cooling water circulates through the cooling passage 3d, whereby the first electrode 3 and the protective film 6a on the first electrode 3 whose temperatures are increased by heat that is generated during plasma processing are cooled. The cooling passage 3d and the cooling mechanism 10 constitute a cooling means for cooling the first electrode 3.

A vacuum-evacuating section 8 is connected, via a valve opening mechanism 7, to an exhaust port 1a that communicates with the exhaust space 2a in the processing room 2. If the vacuum-evacuating section 8 is driven with the valve opening mechanism 7 in an open state, the processing room 2 of the vacuum chamber 1 is vacuum-evacuated and the pressure inside the processing room 2 is lowered. The vacuum-evacuating section 8 is a pressure lowering means for lowering the pressure inside the processing room 2 by exhausting the processing room 2 through the exhaust port 1a which communicates with the exhaust space 2a.

The first electrode 3 is electrically connected to a radio-frequency power section 17 via a matching circuit 16. If the radio-frequency power section 17 is driven, a radio-frequency voltage is applied between the first electrode 3 and the second electrode 4 which is electrically continuous with the vacuum chamber 1 that is grounded by a grounding portion 19, whereby plasma discharge occurs in the processing room 2. The matching circuit 16 serves for impedance matching between the radio-frequency power section 17 and a plasma discharge circuit for generating plasma in the processing room 2. The first electrode 3, the second electrode 4, and the radio-frequency power section 17 constitute a plasma generating means for generating plasma for plasma processing of the silicon wafer 6 that is mounted on the mounting surface.

An electrostatic absorption DC power section 18 (called "DC power section" in the claims) is also connected to the first electrode 3 via an RF filter 15. If the electrostatic absorption DC power section 18 is driven, negative charge is accumulated in the surface of the first electrode 3. If plasma is generated in the processing room 2 in this state by driving the radio-frequency power section 17, a DC circuit that connects the silicon wafer 6 that is mounted on the first electrode 3 to the grounding portion 19 via the plasma in the processing room 2, whereby a closed DC circuit that connects the first electrode 3, the RF filter 15, the electrostatic absorption DC power section 18, the grounding portion 19, the plasma, and the silicon wafer 6 in this order is formed. As a result, positive charge is accumulated in the silicon wafer 6.

Coulomb force acts between the negative charge accumulated in the first electrode 3 and the positive charge accumulated in the silicon wafer 6, and causes the silicon wafer 6 to be held by the first electrode 3 via the protective film 6a that serves as a dielectric. At this time, the RF filter 15 prevents the radio-frequency voltage of the high-frequency power section 17 from being applied directly to the electrostatic absorption DC power section 18. The first electrode 3 and the electrostatic absorption DC power section 18 constitute an electrostatic absorbing means for causing the first electrode 3 to hold the silicon wafer (plate-like substrate) 6 by electrostatic absorption. The polarity of the electrostatic absorption DC power section 18 may be opposite to the above-described one.

Next, the structure of the second electrode 4 will be described in detail. The second electrode 4 has the central electrode portion 4a and a projection portion 4f that is made of an insulating material and projects from the outer periphery of the electrode portion 4a. Having a larger external size than the first electrode 3 does, the projection portion 4f extends outside the first electrode 3. A gas blowing-out portion 4e is provided so as to occupy a central portion of the bottom surface of the second electrode 4, and supplies a plasma generation gas for causing plasma discharge in the discharge space 2b. The gas blowing-out portion 4e is a member produced by shaping, into a circular plate, a porous material having a number of minute holes inside. The gas blowing-out portion 4e causes a plasma generation gas that has been supplied to a gas storage space 4g to be supplied to the discharge space 2b uniformly by blowing out the gas uniformly through the minute holes.

A gas supply hole 4c that communicates with the gas storage space 4g is formed in the support portion 4b, and is connected to a plasma generation gas supply section 21 via an opening/closing valve 20. If the plasma generation gas supply section 21 is driven in a state that the opening/closing valve 20 is opened, a plasma generation gas containing a fluorine-based gas is supplied to the discharge space 2b via the gas blowing-out portion 4e.

A coolant passage 4d for cooling is formed in the second electrode 4 and is connected to the cooling mechanism 10. If the cooling mechanism 10 is driven, a coolant such as cooling water circulates through the cooling passage 4d, whereby the second electrode 4 whose temperature is increased by heat that is generated during plasma processing is cooled.

As shown in FIG. 3, an opening 1b for input/output of a processing object is formed through a sidewall of the processing room 2 (also see FIG. 5). A door 22 that is elevated and lowered by an opening/closing mechanism 23 is provided outside the opening 1b; the opening 1b is opened or closed by lowering or elevating the door 22. FIG. 4 shows how the silicon wafer 6 is input or output in a state that the opening is 1b is opened by lowering the door 22. In a state that a transport space is secured over the first electrode 3 by elevating the second electrode 4 with the elevation mechanism 24, an absorption head 25 that is held by an arm 25a is inserted into the processing room 2 through the opening 1b to input or output the silicon wafer 6. In the above-described configuration in which the wide exhaust space 2a is secured, a long inter-electrode distance can be secured when the second electrode 4 is elevated, which facilitates a manipulation of inputting or outputting a processing object.

A plan positional relationship between the processing room 2, the first electrode 3, the silicon wafer 6 mounted on the first electrode 3, and the second electrode 4 will now be described with reference to FIG. 5. In FIG. 5, which is a horizontal sectional view of the vacuum chamber 1, concentric circles represent, in order from the outside, the inner surface 2c of the processing room 2 (i.e., the vacuum chamber 1), the outer side surface 4h (see FIG. 6) of the second electrode 4, the outer side surface 3h of the first electrode 3, the boundary line P1 indicating the outer periphery of the silicon wafer 6, and the boundary line P2 on the top surface of the first electrode 3.

As seen from FIG. 5, since the processing room 2 and the second electrode 4 are generally cylindrical, a space S1 that is formed between the inner surface 2c of the processing chamber 2 and the outer side surface 4h of the second electrode 4 has a generally cylindrical space that is interposed between the circumferential surfaces of two concentric cylinders except the portion continuous with the opening 1b.

Next, a description will be made of a gas flow path for guiding a gas outward from the discharge space 2b and a gas exhaust path for exhausting the thus-guided gas to the exhaust space 2a. As shown in FIG. 6, in a state that the second electrode 4 is lowered, the space S1 having a generally constant width G1 over the entire circumference of the second electrode 4 is formed between the inner surface 2c of the processing chamber 2 (i.e., the vacuum chamber 1) and the side surface 4h of projection portion 4f of the second electrode 4. The space S1 serves as a gas exhaust path for guiding a gas from the discharge space 2a to the exhaust space 2b.

A space S2 having a generally constant width G2 over the entire circumference of the second electrode 4 is formed between the bottom surface of the projection portion 4f and the top surface of the insulator 5A that is provided around the first electrode 3. The space S2 serves as a gas flow path for guiding outward a gas that is supplied from the bas blowing-out portion 4e to the discharge space 2b and a reaction gas that is produced by plasma discharge.

The dimensions of the related portions are set so that both of the widths G1 and G2 become smaller than a maximum dimension H of the discharge space 2a in the height direction (see FIG. 3). With this measure, the conductance of each of the space S1 as the gas exhaust path and the space S2 as the gas flow path can be made smaller than the conductance of the exhaust space 2a (conductance represents the degree of easiness of gas flow).

In a low-pressure processing room 2, a plasma generation gas assumes a molecular flow in which has molecules have a long mean free path. In this molecular flow state, the conductance is irrelevant to the pressure and proportional to the third power of the inter-wall distance of a space concerned. Therefore, the conductance of each of the spaces S1 and S2 is smaller than the conductance of the exhaust space 2a to a greater extent when the widths G1 and G2 are smaller than the dimension H. That is, in plasma processing that is performed under a low pressure, a gas flows through the exhaust space 2a more easily than in through each of the spaces S1 and S2.

Therefore, in exhausting a gas from the discharge space 2b through the exhaust port 1a during plasma processing, a gas that has entered the exhaust space 2a from the space S1 is exhausted quickly through the exhaust port 1a because of the large conductance of the exhaust space 2a; no large variation occurs in the gas flow state distribution in the exhaust space 2a. As a result, for a gas that is entering the exhaust space 2a from the space S1, an almost uniform flow state is attained over the entire circumference of the second electrode 4. Similarly, for a gas that is entering the space S1 from the space S2, an almost uniform flow state is attained over the entire circumference of the second electrode 4. In this manner, the state of a gas in the discharge space 2a is made uniform, whereby the distribution of the degree of etching by plasma processing can also be made uniform.

The configuration of the plasma processing apparatus has been described above. A plasma processing method will now be described below with reference to the drawings. Plasma processing is performed in a state that the silicon wafer 6 to whose front surface the protective film 6a is stuck as an insulating layer is held by the top surface of the first electrode 3 by electrostatic absorption and the first electrode 3 is being cooled.

First, the silicon wafer 6 as a processing object is transported into the processing room 2 and mounted on the first electrode 3. After the opening 1b is closed, the vacuum absorption pump 12 is driven, whereby the silicon wafer 6 is vacuum-sucked via the absorption holes 3e and the suction hole 3c; the silicon wafer 6 is held by the top surface 3g of the first electrode 3 by vacuum absorption in such a manner as to be in close contact with the top surface 3g.

Then, after the processing room 2 is vacuum-evacuated by driving the vacuum-evacuating section 8, a plasma generation gas is supplied from the plasma generation gas supply section 21 to the processing room 2. Then, a DC voltage is applied between the first electrode 3 and the second electrode 4 by driving the electrostatic absorption DC power section 18 and plasma discharge is started by driving the radio-frequency power section 17. As a result, plasma is generated in the discharge space 2b and plasma processing is performed on the silicon wafer 6. During the plasma processing, electrostatic absorption force occurs between the first electrode 3 and the silicon wafer 6 and the silicon wafer 6 is held by the first electrode 3 by the electrostatic absorption force.

In this electrostatic absorption, as shown in FIG. 2, the silicon wafer 6 is placed on the first electrode 3 in such a manner that the central portion D of the protective film 6a is in contact with the top surface central area A of the first electrode 3 and the outer peripheral portion E of the former is in contact with the insulating coating 3f of the top surface peripheral area B of the latter. The silicon wafer 6 is electrostatically absorbed on the top surface central area A by mainly utilizing the central portion D of the protective film 6a as a dielectric for electrostatic absorption. The outer peripheral portion E of the protective film 6a is in close contact with the insulating coating 3f, whereby the top surface central area A of the first electrode 3 is insulated from plasma.

Then, the gas line switching opening/closing mechanism 11 is driven, whereby the vacuum absorption is stopped and He is applied from behind. Specifically, after the holding of the silicon wafer 6 by the first electrode 3 by vacuum absorption is canceled, a helium gas for heat conduction is supplied from the He gas supply section 14 via the suction hole 3c to fill the absorption holes 3e with the helium gas. During plasma processing, the first electrode 3 is cooled by the cooling mechanism 10. The heat of the silicon wafer 6 whose temperature is increased by the plasma processing is transmitted to the first electrode 3 via the helium gas that is a highly heat-conductive gas. In this manner, the silicon wafer 6 can be cooled efficiently.

After a prescribed plasma processing time has elapsed and the discharge has finished, the backside He application is stopped and vacuum absorption is started again. As a result, the silicon wafer 6 is held by the first electrode 3 by vacuum absorption force instead of the electrostatic absorption force that has disappeared because of the end of the plasma discharge.

Subsequently, the driving of the electrostatic absorption DC power section 18 is stopped (i.e., the DC voltage is turned off) and an opening-to-air mechanism 9 is driven to open the processing room 2 to the ambient air. Then, the gas line switching opening/closing mechanism 11 is driven again to stop the vacuum absorption. Wafer blowing is performed thereafter. That is, a nitrogen gas is supplied via the suction hole 3c and blown out of the absorption holes 3e, whereby the silicon wafer 6 is detached from the first electrode 3. Then, the opening 1b is opened and the silicon wafer 6 is transported out of the processing room 2. Finally, the wafer blowing is stopped to complete the one cycle of plasma processing.

The shapes of the peripheral portion of the first electrode and the insulating coating are not limited to those of the above embodiment and may be changed as shown in FIG. 7B. FIG. 7A shows, for comparison, the peripheral portion of the first electrode 3 and the insulating coating 3f of FIGS. 1–6. FIG. 7B shows a first electrode 103 and an insulating coating 103f having modified shapes.

The modified shapes are such that the diameter D3 of the first electrode 103 is set smaller than the diameter D2 of the first electrode 3 shown in FIG. 7A and that the top surface of the outer peripheral portion of the first electrode 103 is rounded. The insulating coating 103f is formed in an area outside the same position as the boundary line P2 shown in FIG. 7A so as to cover the rounded outer peripheral portion and a top portion of the outer side surface of the first electrode 103. This structure also prevents an abnormal discharge during plasma processing as in the case of FIG. 7A. In addition, since the insulating coating 103f is rounded, they are not prone to cracks.

With the above structure, the diameter D3 of the first electrode 103 can be made smaller than the diameter D2 of the first electrode 3 shown in FIG. 7A while the above advantages are secured; the first electrode can be made more compact for silicon wafers having the same diameter D1. This makes it possible to increase the plasma density over the silicon wafer 6 and thereby increase the etching rate even when plasma processing performed with the same radio-frequency output power. Further, the external size B2 of a vacuum chamber 101 can be made smaller than the external size B1 of the vacuum chamber 1 shown in FIG. 7A, which makes the apparatus more compact.

As described above, in the plasma processing apparatus according to the embodiment, the top surface of the first electrode 3 that holds, by electrostatic absorption, the silicon wafer 6 to which the protective film 6a is stuck as an insulating layer consists of the top surface central area A in which the conductor is exposed and the ring-shaped top surface peripheral area B that surrounds the top surface central area A and in which the conductor is covered with the insulating coating 3f.

Therefore, when the silicon wafer 6 is held by electrostatic absorption, the silicon wafer 6 can be held by sufficient electrostatic holding force by bringing the conductor into direct contact with the silicon wafer 6 in the top surface central area A. And the cooling efficiency can be increased by bringing the protective film 6a of the silicon wafer 6 into close contact with the conductor of the first electrode 3. This prevents thermal damage to the silicon wafer 6 and the protective film 6a, and makes it possible to realize efficient plasma processing exhibiting a high etching rate.

Further, in the above configuration, the peripheral portion of the first electrode 3 is covered with the insulating coating 3f (an abnormal discharge tends to occur between the peripheral portion and plasma in the discharge space 2b) and the related dimensions are set so that the inner periphery of the insulating coating 3*f* is necessarily covered with the silicon wafer 6. This prevents an abnormal discharge during plasma processing and thereby realize stable operation of the apparatus.

According to the invention, the top surface of the electrode for holding a substrate by electrostatic absorption consists of the top surface central area that is inside the boundary line that is distant inward by a prescribed length from the outer periphery of the substrate and in which the conductor is exposed, and the ring-shaped top surface peripheral area that surrounds the top surface central area and in which the conductor is covered with the insulating coating. This structure makes it possible to hold the substrate by sufficient electrostatic holding force and to increase the cooling efficiency of the substrate by bringing the substrate into close contact with the electrode.

What is claimed is:

1. A plasma processing method in which an electrode that is a conductor and has a top surface that is greater in external size than a substrate to be plasma-processed that has an insulating layer on a front surface thereof is provided in a processing room, the top surface of the electrode has a top surface central area that is inside a boundary line that is distant inward by a prescribed length from an outer periphery of the substrate and in which the conductor is exposed and a ring-shaped top surface peripheral area that surrounds the top surface central area and in which the conductor is covered with an insulating coating, and plasma processing is performed in a state that the substrate is held by the top surface of the electrode by electrostatic absorption and the electrode is being cooled, comprising:

mounting the substrate on the top surface of the electrode in such a manner that a central portion and a peripheral portion of the insulating layer of the substrate are in contact with the top surface central area and the insulating coating in the top surface peripheral area, respectively;

electrostatically absorbing the substrate on the top surface central area by mainly utilizing the central portion of the insulating layer as a dielectric for electrostatic absorption; and insulating the top surface central area of the electrode from plasma by bringing the outer peripheral portion of the insulating layer into close contact with the insulating coating.

2. The plasma processing method according to claim 1, wherein the substrate is a semiconductor substrate on the front surface of which logic circuits are formed, and that a back surface of the semiconductor substrate is etched by the plasma processing.

3. The plasma processing method according to claim 2, wherein microcracks that have developed on the back surface of the semiconductor substrate in mechanical processing are etched away.

* * * * *